United States Patent
Shimohara

(10) Patent No.: US 6,667,598 B2
(45) Date of Patent: Dec. 23, 2003

(54) CIRCUIT FOR GENERATING THREE-PHASE PWM SIGNAL

(75) Inventor: Kazunari Shimohara, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/109,250

(22) Filed: Mar. 28, 2002

(65) Prior Publication Data

US 2002/0143425 A1 Oct. 3, 2002

(30) Foreign Application Priority Data

Mar. 29, 2001 (JP) .......................... 2001-097409

(51) Int. Cl.[7] ................................. H02P 5/28
(52) U.S. Cl. .................. 318/811; 318/723; 318/722; 318/254
(58) Field of Search ................. 318/723, 722, 318/724, 254, 138, 439, 459, 811; 388/907.5

(56) References Cited

U.S. PATENT DOCUMENTS

| 6,026,126 | A | * | 2/2000 | Gaetano ..................... 375/296 |
| 6,225,774 | B1 | * | 5/2001 | Masaki et al. ............... 318/723 |
| 6,512,341 | B2 | * | 1/2003 | Matsushiro et al. .......... 318/254 |

FOREIGN PATENT DOCUMENTS

| JP | 4-172995 | 6/1992 |
| JP | 5-176547 | 7/1993 |
| JP | 7-308071 | 11/1995 |
| JP | 8-261794 | 10/1996 |
| JP | 8-317685 | 11/1996 |
| JP | 9-47065 | 2/1997 |
| JP | 9-121558 | 5/1997 |
| JP | 2885256 | 2/1999 |
| JP | 11-122938 | 4/1999 |
| JP | 2000-184730 | 6/2000 |

* cited by examiner

Primary Examiner—Karen Masih
(74) Attorney, Agent, or Firm—Scully, Scott, Murphy & Presser

(57) ABSTRACT

There is provided a control circuit including (a) a first circuit for generating a three-phase PWM (pulse width modulation) signal, the circuit having functions of generating a PWM signal necessary for driving a three-phase invertor motor, generating interruption at a carrier period, and generating interruption at an intermediate point of a carrier period, and (b) a second circuit for generating an analog-digital start trigger in synchronization with a timing at which the PWM signal is output. For instance, the second circuit includes a first compare register having a two-staged structure, and a second compare register having a two-staged structure, and the first circuit includes a PWM timer. The first and second compare registers makes comparison with an output signal transmitted from the PWM timer to thereby generate the analog-digital start trigger.

17 Claims, 10 Drawing Sheets

REPEAT

CIRCUIT FOR GENERATING THREE-PHASE PWM SIGNAL

BACKGROUND OF THE INVENTION

1. Field of the Invention

The invention relates to a control circuit including a circuit which generates a three-phase PWM (pulse width modulation) signal, and more particularly to a control circuit including a circuit for generating a three-phase PWM signal, and a circuit for carrying out feedback control for a three-phase invertor motor when the three-phase PWM signal is generated.

2. Description of the Related Art

FIG. 1 is a block diagram of a conventional circuit for generating a three-phase PWM signal.

The circuit for generating a three-phase PWM signal is comprised of a timer 21, a first compare register 22, a second compare register 24, a third compare register 26, a fourth compare register 28, a first buffer register 23, a second buffer register 25, a third buffer register 27, a fourth buffer register 29, an up- and down-counting flag 30, a first circuit 31 for generating a PWM signal, a second circuit 32 for generating dead time, and a third circuit 33 for controlling an output to be transmitted from the circuit.

The timer 21 generates a carrier period having a PWM waveform. If a carrier wave has a triangular waveform, the timer 21 carries out counting-up and counting-down operations.

The first compare register 22 controls a period of the timer 21. The first compare register 22 always makes comparison with an output transmitted from the timer 21, and converts an operation to be carried out by the timer 21 from counting-up operation to counting-down operation, if the first compare register 22 detects coincidence with the output signal transmitted from the timer 21.

The first compare register 22 generates first interruption 34, and the timer 21 generates second interruption 35.

The up- and down-counting flag 30 indicates a status of the timer 21. While the timer 21 is in counting-up operation, the up- and down-counting flag 30 is in a low level, whereas while the timer 21 is in counting-down operation, the up- and down-counting flag 30 is in a high level.

The second compare register 24 generates a U-phase timing. The second compare register 24 always makes comparison with an output signal transmitted from the timer 21, and outputs a coincidence signal or a one shot pulse signal, if the second compare register 24 detects coincidence with the output signal.

Similarly, the third compare register 26 generates a V-phase timing. The third compare register 26 always makes comparison with an output signal transmitted from the timer 21, and outputs a coincidence signal or a one shot pulse signal, if the third compare register 26 detects coincidence with the output signal.

Similarly, the fourth compare register 28 generates a W-phase timing. The fourth compare register 28 always makes comparison with an output signal transmitted from the timer 21, and outputs a coincidence signal or a one shot pulse signal, if the fourth compare register 28 detects coincidence with the output signal.

The coincidence signals generated by the second to fourth compare registers 24, 26 and 28 are transmitted to the first circuit 31. On receipt of the coincidence signals, the first circuit 31 generates a signal based on which positive-phase and opposite-phase signals in each of the phases are generated.

The signal generated in the first circuit 31 is transmitted to the second circuit 32. Based on the received signal, the second circuit 32 generates a timing to which dead time is added. Herein, dead time means a time for preventing positive and opposite phases of an invertor from short-circuiting with each other.

The second circuit 32 transmits its output signal to the third circuit 33, which then transmits U0, U1, V0, V1, W0 and W1 signals to terminals of a microcomputer.

FIG. 5 is a timing chart showing an operation of the timer 21, coincidence timings in the compare registers 22, 24, 26 and 28, and timings of the terminals.

A gap in a timing between U0 and U1 signals, a gap in a timing between V0 and V1 signals, and a gap in a timing between W0 and W1 signals are all equal to a dead time width.

As illustrated in FIG. 5, the first interruption 34 is generated by virtue of coincidence between the first compare register 22 and the timer 21. A timing at which the first interruption 34 is generated is a summit of a triangular wave carrier.

The second interruption 35 is generated by virtue of under-flow in the timer 21. A timing at which the under-flow is generated is a bottom of a triangular wave carrier.

In accordance with the timing chart of FIG. 5, the timer 21 makes triangular wave operation, and coincidence timings in the first to fourth compare registers 22, 24, 26 and 28 are symmetrical about a summit of the triangular wave. This is called a triangular wave carrier symmetrical mode.

A conventional circuit for generating a three-phase PWM signal operates in the above-mentioned manner.

A circuit for generating a three-phase PWM signal is generally designed to include a circuit for generating an analog-digital trigger, in order to conduct feedback control to a three-phase inverter motor.

Such a circuit for generating an analog-digital trigger has been conventionally used as an external circuit for a microcomputer. Because of recent demand of cost reduction, down-sizing of a substrate, and accurate control for effectively rotating a motor, it is presently required to conduct both control to a three-phase PWM signal and feedback control through a single micro-computer.

If feedback control is frequently conducted, a central processing unit (CPU) would have increased burden in dealing with data. Hence, there is also a demand of reduction in a time for dealing with data through software in CPU.

In particular, a system for simultaneously controlling a plurality of motors such as a fan motor or a compressor motor in an air-conditioner is accompanied with a serious problem of an increase in a time necessary for dealing with data through software in CPU.

In order to solve such a problem, for instance, Japanese Unexamined Patent Publication No. 9-121558 (A) has suggested a method of detecting a current in a PWM invertor by means of an analog-digital convertor.

In the suggested method, a current output from a PWM invertor is detected by an analog-digital convertor.

FIG. 3 is a block diagram illustrating a basic structure of a three-phase invertor motor. With reference to FIG. 3, a current output from a PWM invertor is detected at points Iu, Iv and Iw in the suggested method.

A timing at which a current output from a PWM invertor is detected is a lowest point in a PWM carrier. In other word, referring to FIG. 5 again, a timing at which a current output from a PWM invertor is detected is only a point corresponding to the second interruption 35.

However, it may be necessary to detect an output current of a PWM invertor at a point Ia in FIG. 3 in dependence on whether the three-phase invertor motor include a sensor and further on a structure of a system.

However, there cannot be found, in the suggested method, a concept of deviating an analog-digital conversion timing to a particular timing associated with a PWM output. Hence, the suggested method is inevitably accompanied with a problem that the suggested method can be applied only to a system in which currents Iu, Iv and Iw are directly detected.

Japanese Unexamined Patent Publication No. 4-172995 (A) has suggested a method of adjusting a timing at which a current output from an inverter is detected. The suggested method is carried out by means of an inverter additionally including only one compare register which generates a timing at which analog-digital conversion is to be carried out.

However, the suggested method is accompanied with problems that a time necessary for dealing with data through software is unavoidably long, because the compare register has one-stage structure, it would be quite difficult to generate two or more analog-digital timings, because the compare register has one-stage structure, it is impossible to select a plurality of analog-digital triggers, because an analog-digital trigger is connected merely to an analog-digital start, a burden for dealing with data through software is high, because a value is set in the compare register through software, and so on. Accordingly, the suggested method is not suitable to feedback control.

Japanese Unexamined Patent Publication No. 8-317685 (A) has suggested an invertor including a first unit for supplying AC power having a variable frequency, to an N-pole three-phase brushless DC motor, and matching a commercially available AC battery to thereby have DC battery, a second unit for converting power supplied from the first unit, to DC current, a third unit for detecting DC current output from the second unit, an inverter which converts DC current output from the second unit, into AC current having a variable frequency, and supplying the AC current to turns of the brushless DC motor, and a capacitor connected in parallel in three-phase between the invertor and the brushless DC motor.

Japanese Unexamined Patent Publication No. 8-261794 (A) has suggested an encoder including first means for generating an analog signal in dependence on a position of an object, second means for sampling the analog signal and converting the sampled analog signal to digital data, and third means for obtaining data indicative of a position of the object, based on the digital data, characterized by fourth means for estimating movement of the object during delay time necessary for sampling the analog signal and outputting data indicative of a position, based on newly sampled position data and previously sampled position data, and outputting both position data obtained by adding the estimated movement to the newly sampled position data, the estimated movement in a sampling period, and the newly sampled position data.

Japanese Unexamined Patent Publication No. 7-308071 (A) has suggested an invertor controller comprised of a plurality of switching devices, and converting DC voltage to AC voltage, characterized by first means for detecting a first voltage output from the invertor, second means for subtracting the first voltage from an instructed output voltage to thereby calculate a voltage error, third means for outputting compensation, based on an error voltage selected among respective phases of error voltages in accordance with whether which is greater among respective phases of the error voltages, fourth means for adding the selected compensation and the instructed output voltage to each other to calculate a duty voltage, and a PWM circuit receiving the duty voltage, and outputting a signal by which the switching devices are turned on or off, in accordance with the duty voltage.

Japanese Patent No. 2885256 (B2) has suggested a microcomputer which includes a signal generating circuit which generates a plurality of pulse width modulation (PWM) signals defined by a carrier wave, and which controls an object, based on the pulse width modulation signals. The signal generating circuit is comprised of a timer which outputs a signal which varies in the same way as a waveform defining the carrier wave, a control register which controls a period of the timer, a reload register which stores a count, and a plurality of control blocks transmitting the plurality of pulse width modulation signals, based on the signal output from the timer and the count stored in the reload register. Each of the control blocks is comprised of a compare register which always compares the signal output from the timer and a reference value to each other, and transmits a coincidence signal, if they are coincident with each other, a logic circuit which is set by an interruption signal output from the control register, and reset by the coincidence signal, a transfer register which transfers the reference value to the compare register at a predetermined timing, a one-shot timer into which the count stored in the reload register is set in synchronization with the logic circuit being set or reset, and means for generating the pulse width modulation signal, based on a signal output from the one-shot timer and a signal output from the logic circuit.

Japanese Unexamined Patent Publication No. 9-47065 (A) has suggested a motor controller including a dead time compensator which outputs AC voltage having a variable frequency from DC battery through a PWM-controlled invertor, to thereby drive a motor, control a motor current in feedback control, and compensate for voltage drop which occurs due to dead time. The motor controller further includes first means for sampling a motor current, second means for outputting an instruction indicative of a voltage, based on a current sampled by first means, third means for compensating for the instruction with the sampled current, fourth means for updating a voltage output from third means, as PWM instruction, and fifth means for successively operating first to fourth means at a predetermined period. First, third, fourth and second means are caused to operate in this order at timings generated by fifth means.

SUMMARY OF THE INVENTION

In view of the above-mentioned problems in the prior art, it is an object of the present invention to provide a control circuit which has functions of outputting a PWM signal and conducting feedback control both indispensable to three-phase invertor motor control, and which is able to be incorporated into a micro-computer.

It is also an object of the present invention to provide a control circuit which is capable of generating an analog-digital conversion timing by means of a circuit for generating an analog-digital trigger, without an increase in data to be dealt with through software.

In one aspect of the present invention, there is provided a control circuit including (a) a first circuit for generating a three-phase PWM (pulse width modulation) signal, the circuit having functions of generating a PWM signal necessary for driving a three-phase invertor motor, generating interruption at a carrier period, and generating interruption at an intermediate point of a carrier period, and (b) a second circuit for generating an analog-digital start trigger in synchronization with a timing at which the PWM signal is output.

It is preferable that the second circuit includes a first compare register having a two-staged structure, and a second compare register having a two-staged structure, and the first circuit includes a PWM timer. The first and second compare registers make comparison with an output signal transmitted from the PWM timer to thereby generate the analog-digital start trigger.

It is preferable that the first and second compare registers are automatically set up by automatic calculation of a timing at which the PWM signal is output.

It is preferable that the first circuit includes a PWM timer, and the second circuit generates two analog-digital start triggers, one of which is selected in synchronization with counting-up or counting-down operation of the PWM timer.

For instance, the control circuit may further include an auxiliary circuit including (a) a status flag which indicates whether analog-digital conversion is being carried out, (b) a detecting circuit which transmits a detection signal, when at least one of terminals which receive the PWM signal varies with respect to its status, and (c) an error flag setting circuit which sets an error flag when the detection signal is transmitted, while the status flag indicates analog-digital conversion is being carried out.

It is preferable that the error flag setting circuit generates interruption when the error flag has been set.

There is further provided a control circuit including (a) a first circuit for generating a three-phase PWM (pulse width modulation) signal, the circuit having functions of generating a PWM signal necessary for driving a three-phase invertor motor, generating interruption at a carrier period, and generating interruption at an intermediate point of a carrier period, and (b) a second circuit for generating an analog-digital start trigger in synchronization with a timing at which the PWM signal is output. The first circuit includes a PWM timer, and the second circuit includes (b1) first and second compare registers each of which makes comparison with an output signal transmitted from the PWM timer, and outputs a coincidence signal, (b2) first and second buffer registers associated with the first and second compare registers, respectively, and (b3) a third circuit which selects one of coincidence signals transmitted from the first and second compare registers, to thereby generate an analog-digital start trigger signal.

The control circuit may further include a register which stores a value reflecting a time necessary for carrying out analog-digital conversion in an analog-digital convertor equipped in a computer in which the control circuit is equipped in.

It is preferable that the second circuit further includes a selector which selects one of coincidence signals transmitted from the first and second compare registers, when the PWM timer is in counting-up operation, and selects the other, when the PWM timer is in counting-down operation.

It is preferable that the first circuit further includes a flag which indicates whether the PWM timer is in counting-up or counting-down operation, and transmits its output signal to the selector.

It is preferable that transfer to the first compare register from the first buffer register is carried out by interruption generated at under-flow in the PWM timer, if the PWM timer operates in a symmetrical triangle wave.

It is preferable that the first circuit further includes a flag which indicates whether the PWM timer is in counting-up or counting-down operation, and the third circuit is comprised of (b1) a first selector which receives coincidence signals transmitted from the first and second compare registers, (b2) a first latch device which receives a command transmitted from an external central processing unit, (b3) a second latch device which receives a command transmitted from an external central processing unit, and (b4) a second selector which receives both output signals transmitted from the first and second latch devices and an output signal transmitted from the flag, and transmits a selection signal to the first selector to indicate which one of the coincidence signals is to be selected.

The control circuit in accordance with the present invention is designed to include a circuit for generating an analog-digital trigger necessary for feedback control of a three-phase motor, as well as a circuit for outputting a three-phase PWM signal.

As is well known to those skilled in the art, a three-phase motor has three phase, that is, U-phase V-phase and W-phase. When these three phases are to be driven by means of an invertor, a micro-computer transmits a U control signal (PWM signal) and a U-bar control signal (PWM signal) for controlling U-phase, a V control signal (PWM signal) and a V-bar control signal (PWM signal) for controlling V-phase, and a W control signal (PWM signal) and a W-bar control signal (PWM signal) for controlling W-phase.

Herein, non-bared control signals are used for controlling an upper arm of an invertor, that is, a positive phase, and bared signals are used for controlling a lower arm of an invertor, that is, an opposite phase. Control signals to be input to upper and lower arms of an invertor are in inversion relation with each other, and further, are signals to which dead time is added for preventing active periods in an invertor from overlapping one another.

FIG. 2 is a block diagram of the control circuit in accordance with the present invention.

The control circuit is comprised of a first circuit 2 for generating a three-phase PWM signal, and a second circuit 1 for generating an analog-digital trigger. The first circuit 2 has three functions: the first function is to generate PWM signals necessary for a system for driving a three-phase motor by means of an invertor, that is, signals U0 and U1 for controlling upper and lower arms of a U-phase invertor, signals V0 and V1 for controlling a V-phase invertor, and signals W0 and W1 for controlling a W-phase invertor, and to output those signals to terminals; the second function is to generate the second interruption 35 at a carrier period; and the third function is to generate the first interruption 34 at an intermediate point of a carrier period.

The second circuit 1 is comprised of a first compare register 11 and a second compare register 13 both always making comparison with the timer 21 to thereby transmit a coincidence signal, a first buffer register 12 and a second buffer register 14 associated with the first compare register 11 and the second compare register 13, respectively, an A/D trigger selecting circuit 15 which selects one of the coincidence signals transmitted from the first and second compare registers 11 and 13, and outputs an analog-digital start trigger signal 16, and an A/D conversion time setting register 17 which stores a value reflecting a time necessary for conducting analog-digital conversion in an analog-digital convertor equipped in a micro-computer in which the control circuit in accordance with the present invention is also equipped.

Since the second circuit 1 outputs an analog-digital start trigger slightly before a timing at which U-phase varies, when the timer 21 is in counting-down operation, an output signal transmitted from the U-phase first buffer register 25 to which an output signal transmitted from the A/D conversion time setting register 17 is added is transmitted to the second buffer register 14.

Timings at which the first and second buffer registers 12 and 14 transfer their outputs to the first and second compare registers 11 and 13, respectively, are identical with timings at which the first to third buffer registers 25, 27 and 29 transfer their outputs to the first to third compare registers 24, 26 and 28, respectively, in the first circuit 2. That is, the timings are in synchronization with the second periodic interruptions 35 generated from the timer 21.

Designing compare registers to have such a two-staged structure as mentioned above makes it no longer necessary to consider a time necessary for dealing with data through software, because a value for a next period can be set in the previous period.

The A/D trigger selecting circuit 15 selects a coincidence signal transmitted from the first compare register 11 when the timer 21 is in counting-up operation, whereas selects a coincidence signal transmitted from the second compare register 13 when the timer 21 is in counting-down operation.

In order to switch a coincidence signal between the coincidence signals transmitted from the first and second compare registers 11 and 13, an up- and down-counting flag 30 holding status of the timer 21 as to whether the timer 21 is in counting-up or counting-down operation transmits its output signal to the A/D trigger selecting circuit 15.

Thus, the second circuit 1 automatically generates the analog-digital start trigger 16 in synchronization with a timing at which a three-phase PWM signal is output.

FIG. 3 is a circuit diagram of a circuit for controlling a three-phase motor by means of an invertor.

The terminals U0, U1, V0, V1, W0 and W1 of the first circuit 2, illustrated in FIG. 2, control U0, U1, V0, V1, W0 and W1 signals illustrated in FIG. 3.

In order to accurately control a three-phase motor, it would be necessary to always monitor rotation of the three-phase motor, and carry out control by which the monitored rotation is fed-back to a PWM control signal. Hereinbelow, such control is referred to as "feedback control". In order to monitor rotation of a three-phase motor, it would be necessary to detect a U-phase current Iu, a V-phase current Iv and a W-phase current Iw in the three-phase motor by means of an analog-digital convertor.

There are known two methods of detecting those currents.

In the first method, the phase currents Iu, Iv and Iw are directly detected. In the first method, a timing at which analog-digital conversion is carried out is identical with PWM periodic interruption, and accordingly, the second interruption 35 illustrated in FIG. 2 can be used for A/D conversion. However, in order to accomplish analog-digital conversions simultaneously in three signals, each analog-digital conversion has to be carried out at a high rate.

In the second method, only a current running through a point Ia is detected. In the second method, since a sum of the currents Iu, Iv and Iw runs through the point Ia, it would be necessary to carry out analog-digital conversion at a timing at which each of the phase currents runs.

The second circuit 1 for generating an analog-digital trigger in the control circuit in accordance with the present invention makes it possible to carry out such analog-digital conversion. Though timing tuning has to be carried out in the second method, analog-digital conversion is carried out only once at one timing, and hence, the analog-digital conversion is not always necessary to be high-rate A/D conversion.

As having been explained so far, the control circuit in accordance with the present invention automatically generates an optimal analog-digital start trigger regardless of feedback control to be carried out in a three-phase motor. Accordingly, optimal feedback control can be accomplished in one micro-computer without an increase in dealing with data through software.

The advantages obtained by the aforementioned present invention will be described hereinbelow.

As having been explained so far, the control circuit in accordance with the present invention automatically generates an optimal analog-digital start trigger regardless of feedback control to be carried out in a three-phase motor. Accordingly, optimal feedback control can be accomplished in one micro-computer without an increase in dealing with data through software.

In addition, since each of the compare registers is designed to have a two-staged structure in the control circuit in accordance with the present invention, a value for a next period can be set in the previous period. As a result, it is no longer necessary to consider a time necessary for dealing with data through software, when data is dealt with.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
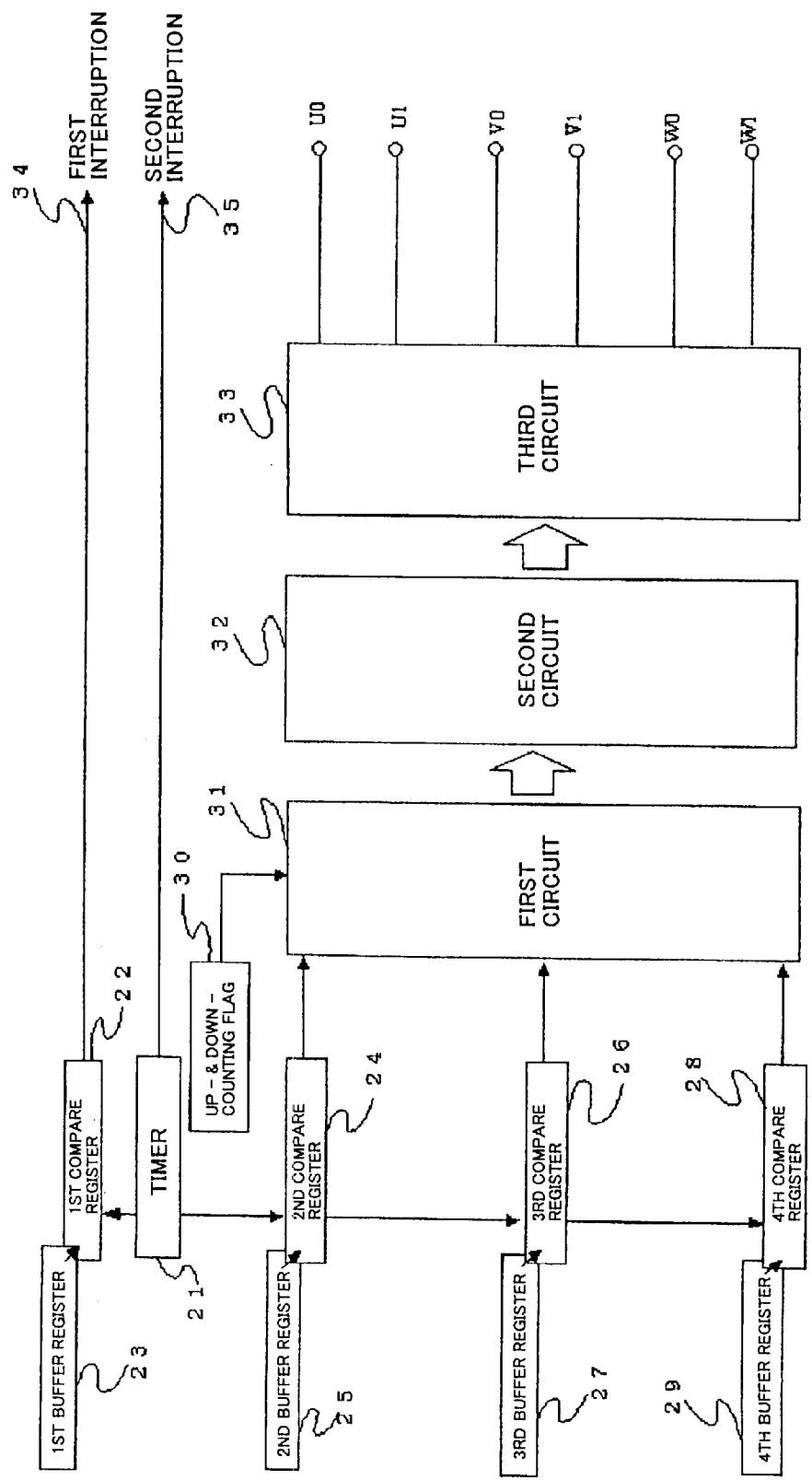
FIG. 1 is a block diagram of a conventional circuit for generating a three-phase PWM signal.
Figure 2:
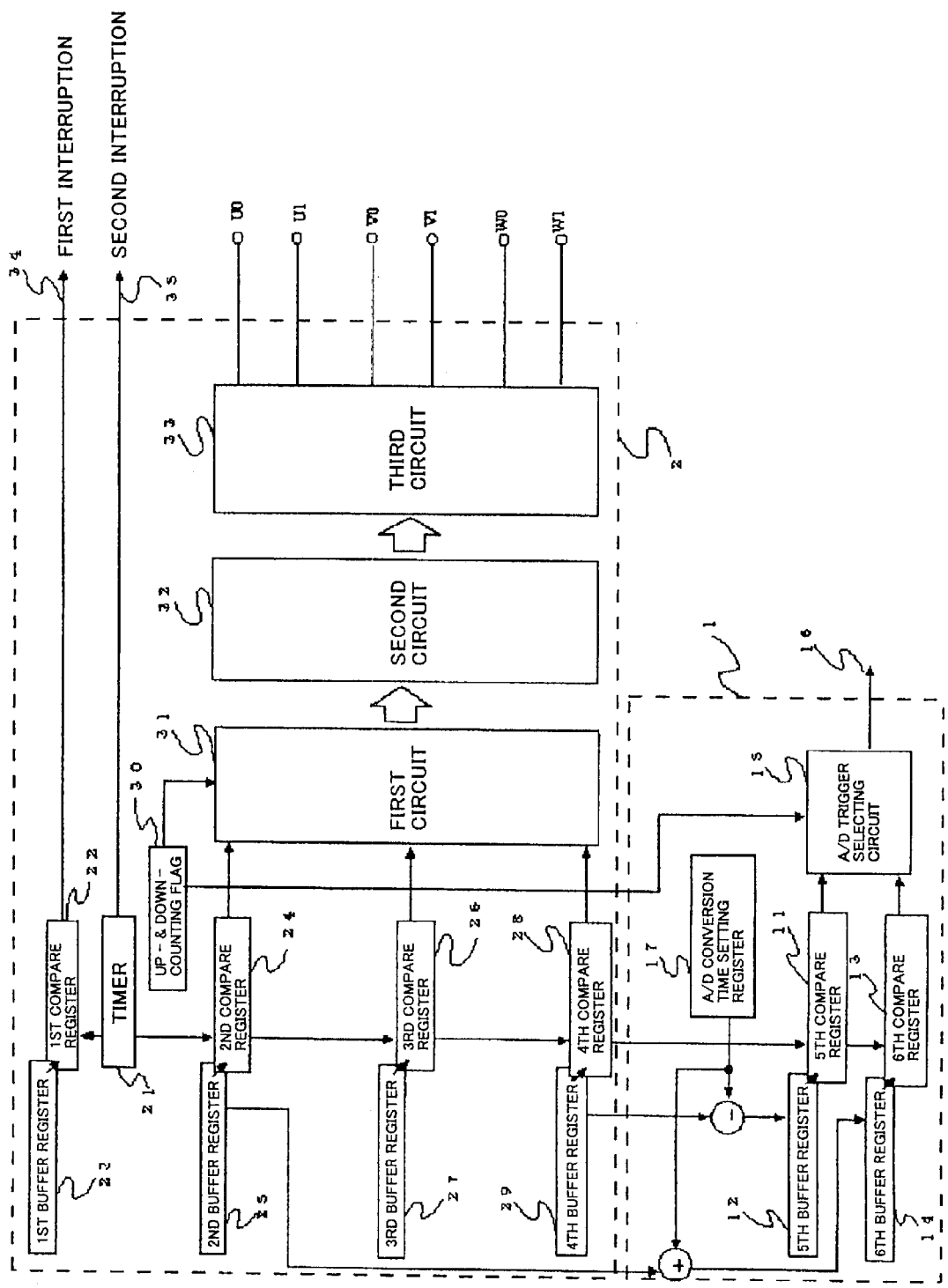
FIG. 2 is a block diagram of a control circuit in accordance with the first embodiment of the present invention.

FIG. 2 is a block diagram of a control circuit in accordance with the first embodiment of the present invention.

The control circuit in accordance with the first embodiment is comprised of a three-phase PWM signal generating circuit 2 for generating a three-phase PWM signal, and an analog-digital trigger generating circuit 1 for generating an analog-digital trigger.

The three-phase PWM signal generating circuit 2 for generating a three-phase PWM signal is comprised of a timer 21, a first compare register 22, a second compare register 24, a third compare register 26, a fourth compare register 28, a first buffer register 23, a second buffer register 25, a third buffer register 27, a fourth buffer register 29, an up- and down-counting flag 30, a first circuit 31 for generating a PWM signal, a second circuit 32 for generating dead time, and a third circuit 33 for controlling an output to be transmitted from the control circuit.

The timer 21 generates a carrier period having a PWM waveform. If a carrier wave has a triangular waveform, the timer 21 carries out counting-up and counting-down operations.

The first compare register 22 controls a period of the timer 21. The first compare register 22 always makes comparison with an output transmitted from the timer 21, and converts an operation to be carried out by the timer 21 from counting-up operation to counting-down operation, if the first compare register 22 detects coincidence with the output signal transmitted from the timer 21.

The first compare register 22 generates first interruption 34, and the timer 21 generates second interruption 35.

The up- and down-counting flag 30 indicates a status of the timer 21. While the timer 21 is in counting-up operation, the up- and down-counting flag 30 is in a low level, whereas while the timer 21 is in counting-down operation, the up- and down-counting flag 30 is in a high level.

The second compare register 24 generates a U-phase timing. The second compare register 24 always makes comparison with an output signal transmitted from the timer 21, and outputs a coincidence signal or a one shot pulse signal, if the second compare register 24 detects coincidence with the output signal.

Similarly, the third compare register 26 generates a V-phase timing. The third compare register 26 always makes comparison with an output signal transmitted from the timer 21, and outputs a coincidence signal or a one shot pulse signal, if the third compare register 26 detects coincidence with the output signal.

Similarly, the fourth compare register 28 generates a W-phase timing. The fourth compare register 28 always makes comparison with an output signal transmitted from the timer 21, and outputs a coincidence signal or a one shot pulse signal, if the fourth compare register 28 detects coincidence with the output signal.

The coincidence signals generated by the second to fourth compare registers 24, 26 and 28 are transmitted to the first circuit 31. On receipt of the coincidence signals, the first circuit 31 generates a signal based on which positive-phase and opposite-phase signals in each of the phases are generated.

The signal generated in the first circuit 31 is transmitted to the second circuit 32. Based on the received signal, the second circuit 32 generates a timing to which dead time is added. Herein, dead time means a time for preventing positive and opposite phases of an invertor from short-circuiting with each other.

The second circuit 32 transmits its output signal to the third circuit 33, which then transmits U0, U1, V0, V1, W0 and W1 signals to terminals of a microcomputer.

The analog-digital trigger generating circuit 1 is comprised of a fifth compare register 15 and a sixth compare register 13 both always making comparison with the timer 21 to thereby transmit a coincidence signal, a fifth buffer register 12 and a sixth buffer register 14 associated with the fifth compare register 11 and the sixth compare register 13, respectively, an A/D trigger selecting circuit 15 which selects one of the coincidence signals transmitted from the fifth and sixth compare registers 11 and 13, and outputs an analog-digital start trigger signal 16, and an A/D conversion time setting register 17 which stores a value reflecting a time necessary for conducting analog-digital conversion in an analog-digital convertor (not illustrated) equipped in a micro-computer in which the control circuit in accordance with the first embodiment is also equipped.

In the analog-digital trigger generating circuit 1, the fifth compare register 11 is associated with the fifth buffer register 12 to thereby define a two-stages structure. The fifth buffer register 12 transfers its output signal to the fifth compare register 11 at the second periodic interruption 35 generated at under-flow of the timer 21, when the timer 21 operates in a symmetrical triangular wave.

The two-staged structure defined by the fifth compare register 11 and the fifth buffer register 12 makes it no longer necessary to consider a time necessary for dealing with data through software, because a value for a next period can be set in the previous period.

The sixth compare register 13 and the sixth buffer register 14 are designed to have the same structures as the structures of the fifth compare register 11 and the fifth buffer register 12, respectively.

The A/D conversion time setting register 17 stores a time necessary for carrying out analog-digital conversion (or a time necessary for sampling) in an analog-digital convertor (not illustrated) equipped in a micro-computer in which the control circuit in accordance with the first embodiment is also equipped. The time necessary for carrying out A/D conversion is dependent on a value designated in a register equipped in the analog-digital convertor, but is generally determined in accordance with a command transmitted from a central processing unit. The A/D conversion time setting register 17 stores a value reflecting the above-mentioned value designated in a register equipped in the analog-digital convertor.

Subtraction between the A/D conversion time setting register 17 and the fourth buffer register 29 is stored in the fifth buffer register 12, and addition of the A/D conversion time setting register 17 and the second buffer register 25 is stored in the sixth buffer register 14.

Thus, an analog-digital trigger timing required for a next period is automatically calculated.

The A/D trigger selecting circuit 15 automatically selects a coincidence signal transmitted from the fifth compare register 11 and a coincidence signal transmitted from the sixth compare register 13, and generates the A/D start trigger 16.

Figure 4:
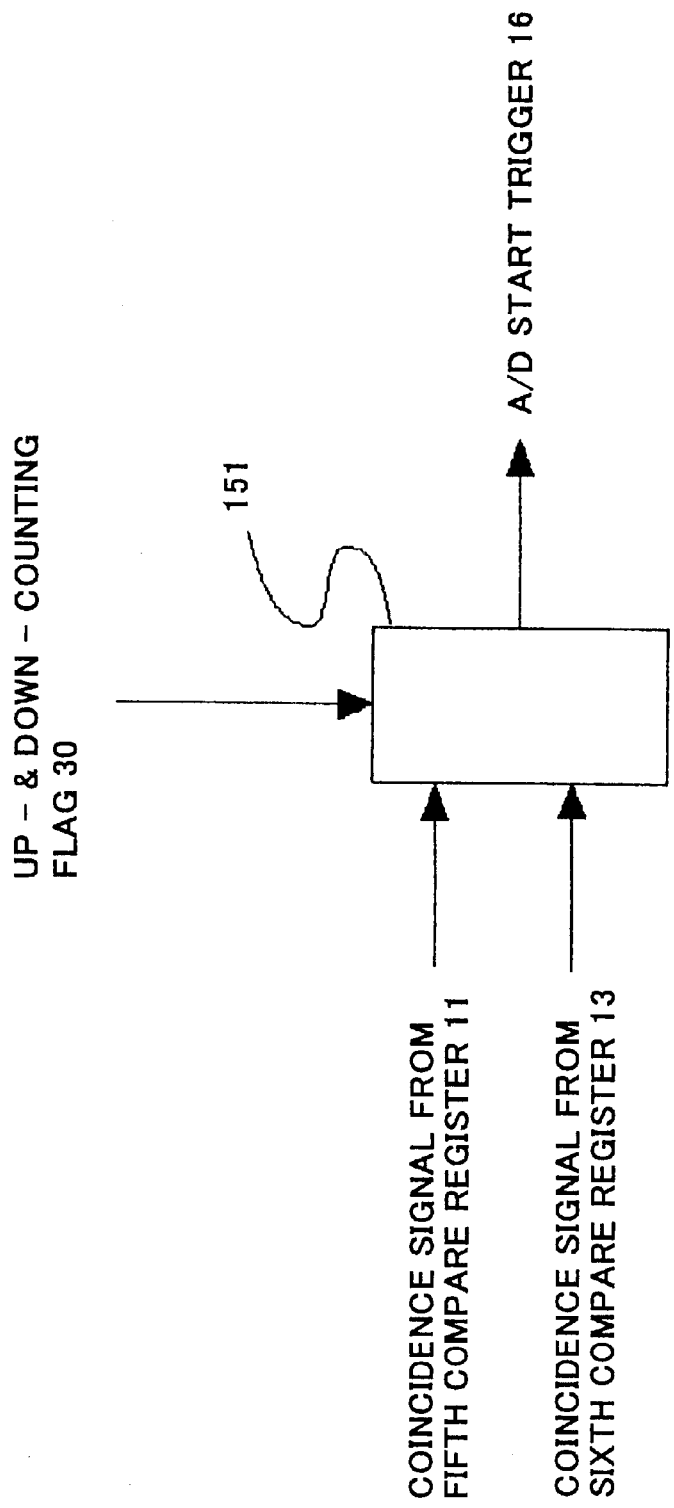
FIG. 4 is a block diagram of an A/D conversion time setting register in the control circuit illustrated in FIG. 2.

FIG. 4 is a block diagram of an example of the A/D trigger selecting circuit 15.

The A/D trigger selecting circuit 15 may be comprised of, for instance, a selector 151 which receives an output signal transmitted from the up- and down-counting flag 30, a coincidence signal transmitted from the fifth compare register 11, and a coincidence signal transmitted from the sixth compare register 13.

The up- and down-counting flag 30 constituting the three-phase PWM signal generating circuit 2 is a status-holding flag. Specifically, the up- and down-counting flag 30 is in a low level when the timer is in counting-up operation, and in a high level when the timer 21 is in counting-down operation.

The selector 151 selects a coincidence signal transmitted from the fifth compare register 11 when the up- and down-counting flag 30 is in a low level, whereas selects a coincidence signal transmitted from the sixth compare register 13 when the up- and down-counting flag 30 is in a high level. The selected coincidence signal is transmitted from the A/D trigger selecting circuit 15 as the A/D start trigger 16. The A/D start trigger 16 is a signal on receipt of which the analog-digital convertor starts analog-digital conversion.

Figure 5:
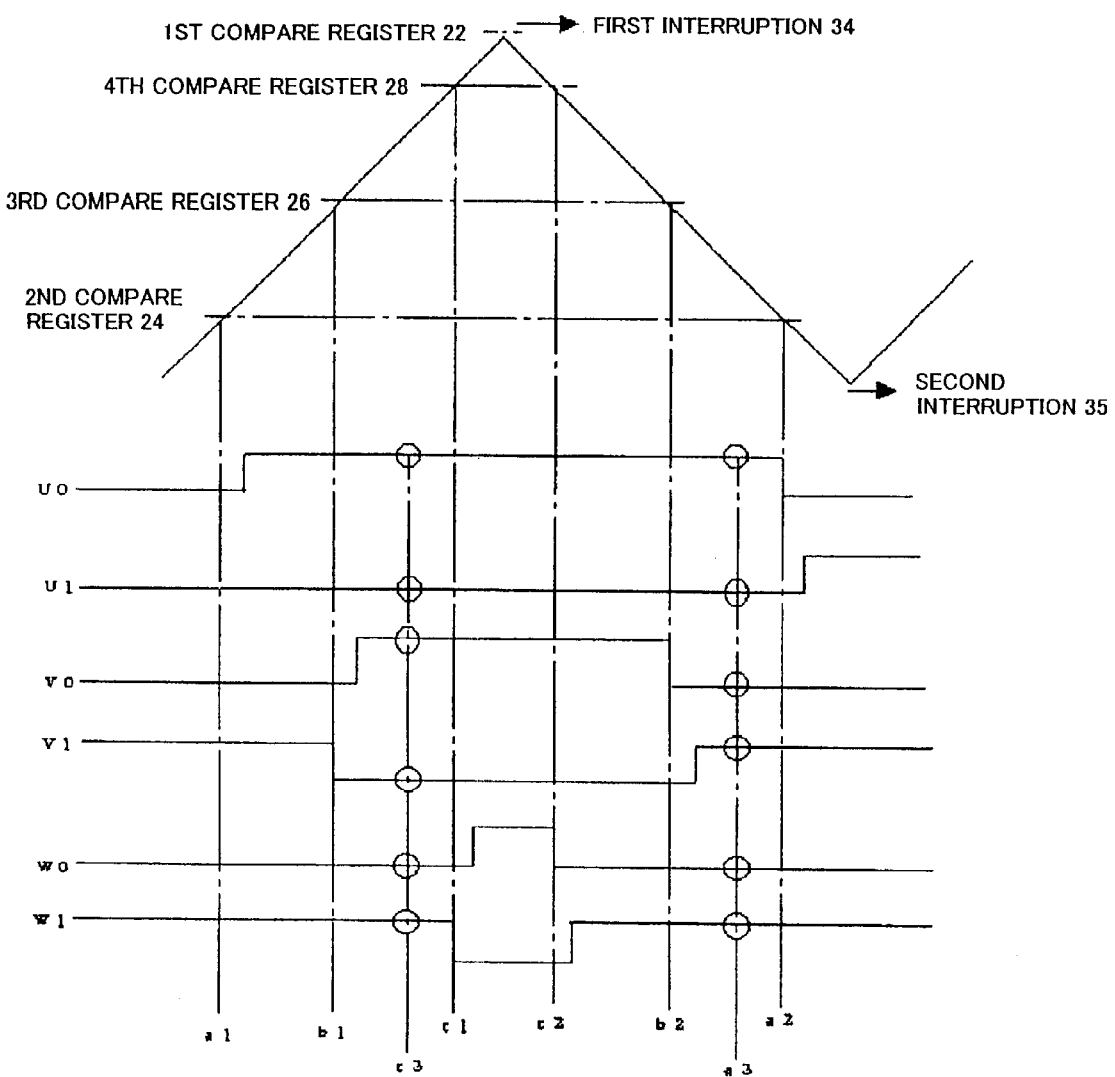
FIG. 5 is a timing chart showing an operation of the control circuit illustrated in FIG. 2.

FIG. 5 is a timing chart showing an operation of the control circuit in accordance with the first embodiment. Hereinbelow is explained an operation of the control circuit in accordance with the first embodiment, with reference to FIG. 5.

First an operation of the three-phase PWM signal generating circuit 2 is explained hereinbelow in order to explain a relation between a timing at which a PWM signal is output for controlling a three-phase invertor motor and a timing at which an analog-digital trigger is output.

The timer 21 generates a carrier period having a PWM waveform. If a carrier wave has a triangular waveform, the timer 21 carries out counting-up and counting-down operations.

The first compare register 22 controls a period of the timer 21. The first compare register 22 always makes comparison with an output transmitted from the timer 21, and converts an operation to be carried out by the timer 21 from counting-up operation to counting-down operation, if the first compare register 22 detects coincidence with the output signal transmitted from the timer 21.

The up- and down-counting flag 30 is a status-holding flag. Specifically, the up- and down-counting flag 30 is in a low level when the timer is in counting-up operation, and in a high level when the timer 21 is in counting-down operation.

The second compare register 24 generates a U-phase timing. The second compare register 24 always makes comparison with an output signal transmitted from the timer 21, and outputs a coincidence signal or a one shot pulse signal, if the second compare register 24 detects coincidence with the output signal.

Similarly, the third compare register 26 generates a V-phase timing. The third compare register 26 always makes comparison with an output signal transmitted from the timer 21, and outputs a coincidence signal or a one shot pulse signal, if the third compare register 26 detects coincidence with the output signal.

Similarly, the fourth compare register 28 generates a W-phase timing. The fourth compare register 28 always makes comparison with an output signal transmitted from the timer 21, and outputs a coincidence signal or a one shot pulse signal, if the fourth compare register 28 detects coincidence with the output signal.

The coincidence signals generated by the second to fourth compare registers 24, 26 and 28 are transmitted to the first circuit 31. On receipt of the coincidence signals, the first circuit 31 generates a signal based on which positive-phase and opposite-phase signals in each of the phases are generated.

The signal generated in the first circuit 31 is transmitted to the second circuit 32. Based on the received signal, the second circuit 32 generates a timing to which dead time is added.

The second circuit 32 transmits its output signal to the third circuit 33, which then transmits U0, U1, V0, V1, W0 and W1 signals to terminals of a microcomputer.

FIG. 5 is a timing chart showing an operation of the timer 21 and various timings.

A gap in a timing between U0 and U1 signals, a gap in a timing between V0 and V1 signals, and a gap in a timing between W0 and W1 signals are all equal to a dead time width.

As illustrated in FIG. 5, the first interruption 34 is generated by virtue of coincidence between the first compare register 22 and the timer 21. A timing at which the first interruption 34 is generated is a summit of a triangular wave carrier.

The second interruption 35 is generated by virtue of under-flow in the timer 21. A timing at which the under-flow is generated is a bottom of a triangular wave carrier.

In accordance with the timing chart of FIG. 5, the timer 21 makes triangular wave operation, and coincidence timings in the first to fourth compare registers 22, 24, 26 and 28 are symmetrical about a summit of the triangular wave.

The three-phase PWM signal generating circuit 2 operates in the above-mentioned manner.

Hereinbelow is explained feedback control to be carried out in the control circuit in accordance with the first embodiment.

Figure 3:
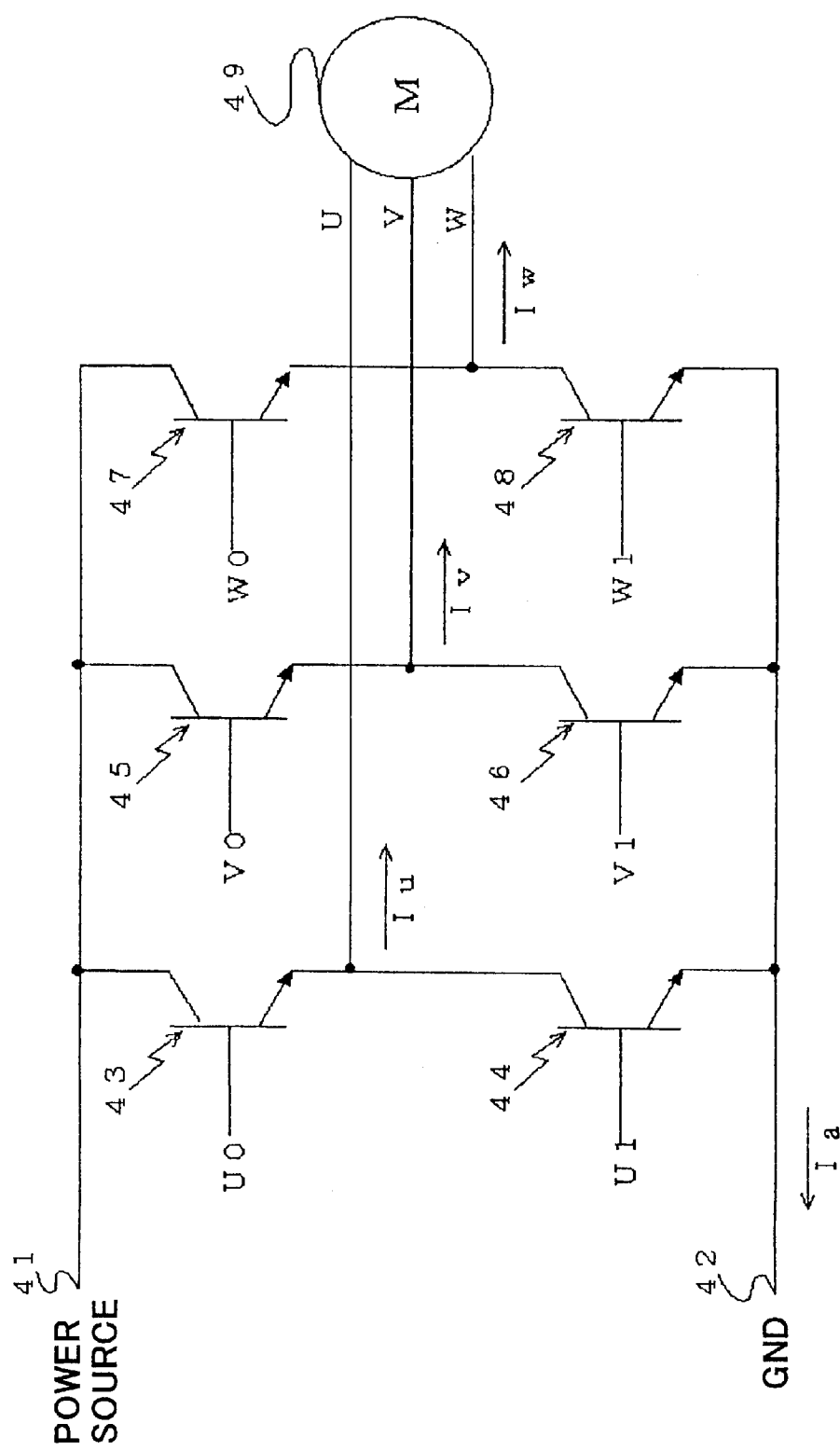
FIG. 3 is a circuit diagram of a circuit for controlling a three-phase motor by means of an invertor.

FIG. 3 is a circuit diagram of a circuit for controlling a three-phase motor by means of an invertor.

The illustrated circuit includes first to sixth bipolar transistors 43, 44, 45, 46, 47 and 48 electrically connected between a power source 41 and a ground (GND) 42, as invertors.

The first bipolar transistor 43 has a collector electrically connected to the power source 41, and an emitter electrically connected to a collector of the second bipolar transistor 44. The second bipolar transistor 44 has a grounded emitter.

The third bipolar transistor 45 has a collector electrically connected to the power source 41, and an emitter electrically connected to a collector of the fourth bipolar transistor 46. The fourth bipolar transistor 46 has a grounded emitter.

The fifth bipolar transistor 47 has a collector electrically connected to the power source 41, and an emitter electrically connected to a collector of the sixth bipolar transistor 48. The sixth bipolar transistor 48 has a grounded emitter.

The first and second bipolar transistors 43 and 44, the third and fourth bipolar transistors 45 and 46, and the fifth and sixth bipolar transistors 47 and 48 are electrically connected in parallel with one another between the power source 41 and the ground 42.

The U0, U1, V0, V1, W0 and W1 signals transmitted from three-phase PWM signal generating circuit 2 are input into the first to sixth bipolar transistors 43, 44, 45 46, 47 and 48, respectively, through their gates.

A current Iu running between an emitter of the first bipolar transistor 43 and a collector of the second bipolar transistor 44, a current Iv running between an emitter of the third bipolar transistor 45 and a collector of the fourth bipolar transistor 46, and a current Iw running between an emitter of the fifth bipolar transistor 47 and a collector of the sixth bipolar transistor 48 are all input into a motor 49.

Hereinbelow is explained the feedback control carried out by detecting a current Ia running towards the ground 42, in the circuit illustrated in FIG. 3.

With reference to the timing chart shown as FIG. 5, it is understood that timings a1 and a2 at which the second compare register 24 and the timer 21 are coincident with each other, timings b1 and b2 at which the third compare register 26 and the timer 21 are coincident with each other, and timings c1 and c2 at which the fourth compare register 28 and the timer 21 are coincident with each other are identical with any one of turning points of the U0, U1, V0, V1, W0 and W1 terminals.

For instance, the timing a1 is identical with a timing at which the U1 terminal falls down, and the timing a2 is identical with a timing at which the U0 terminal falls down.

Signals at the U0, U1, V0, V1, W0 and W1 terminals are timing signals used for controlling gates of invertors in the circuit illustrated in FIG. 3. In a certain period of time after a gate signal has varied, the invertors turn on or off, and hence, an invertor current is in a transition period and not stable in the certain period.

Hence, even if such an invertor current in a transition period were detected, it would not be possible to accomplish accurate feedback control. A timing at which a stable invertor current can be detected is limited to either a timing slightly before the timings a1, a2, b1, b2, c1 and c2 (that is, immediately before a turning-on or turning-off period) or a timing after the turning-on or turning-off period.

After the turning-on or turning-off period, a signal is varied due to taking the dead time, and hence, it would be difficult to adjust a timing. For instance, after the timing a1, the U0 terminal rises up.

If the dead time width were narrowed, a band during which a current can be detected would be quite narrow. Accordingly, it would be preferable to select a timing slightly before the timings a1, a2, b1, b2, c1 or c2 as a timing at which a stable current is detected.

Hereinbelow is explained which timing should be selected actually.

Since the U0, V0 and W0 terminals are all in a low level immediately before the timing a1, the upper transistors (positive-phase transistors) in the invertor are all turned off. Hence, it is meaningless to detect the current Ia.

Since the U0 terminal (positive phase) is turned on and the V0 and W0 terminals (positive phase) are turned off immediately before the timing b1, it would be possible to detect the Iu current as the current Ia.

Since the W1 terminal (opposite phase) is turned on and the U1 and V1 terminals (opposite phase) are turned off immediately before the timing c1, it would be possible to detect the Iw current as the current Ia.

Since the U1, V1 and W1 terminals (opposite phase) are all turned off immediately before the timing c2, the current Ia does not run.

A timing immediately before the timing b2 is identical with a timing immediately before the timing c1. Hence, it would be possible to detect the current Iw as the current Ia.

A timing immediately before the timing a2 is identical with a timing immediately before the timing b1. Hence, it would be possible to detect the current Iu as the current Ia.

As mentioned above, effective timings are a timing immediately before the timing b1, a timing immediately before the timing c1, a timing immediately before the timing b2, and a timing immediately before the timing a2. Herein, the same status is detected at both a timing immediately before the b1 and a timing immediately before the timing a2, and the same status is detected at both a timing immediately before the c1 and a timing immediately before the timing b2. Hence, what is necessary to do is to detect a current only twice in one period.

In general, in order to measure the currents Iu, Iv and Iw, if any two of them were measured, the remaining one can be calculated based on the measured two currents. Accordingly, two statuses are detected in the feedback control.

Hence, in the control circuit in accordance with the first embodiment, subtraction between the fourth buffer register 29 in which a coincidence timing of the fourth compare register 28 in a next period is stored, and the A/D conversion time setting register 17 is stored in the fifth buffer register 12 in the A/D trigger generating circuit 1. As a result, a timing c3 immediately before the timing c1 is automatically generated.

In addition, addition of the second buffer register 25 in which a coincidence timing of the second compare register 24 in a next period is stored, and the A/D conversion time setting register 17 to each other is stored in the sixth buffer register 14 in the A/D trigger generating circuit 1. As a result, a timing a3 immediately before the timing a2 is automatically generated.

The fifth buffer register 12 transfers its output signal to the fifth compare register 11 through the second interruption 35, and the sixth buffer register 14 transfers its output signal to the sixth compare register 13 through the first interruption 34.

The two-staged structure in the compare registers makes it no longer necessary to consider a time necessary for dealing with data through software, because a value for a next period can be set in the previous period.

Since the compare registers 22, 24, 26 and 28 in the three-phase PWM signal generating circuit 2 are designed to have a two-staged structure, the compare registers 11 and 13 in the A/D trigger generating circuit 1 are also designed to have a two-staged structure, because the compare registers 11 and 13 are necessary to operate in synchronization with the compare registers 22, 24, 26 and 28.

The above-mentioned timings c3 and a3 are shown in FIG. 5. Since both the timings c3 and a3 do not overlap periods in which the invertors are turned on or off, it would be possible to detect a current at a timing at which the current is in stable condition.

The timing c3 is within the counting-up operation of the timer 21, and the timing a3 is within the counting-down operation of the timer 21. The A/D trigger selecting circuit 15 having such a structure as illustrated in FIG. 4 selects a coincidence signal (timing c3) transmitted from the fifth compare register 11, as an A/D start trigger when the timer 21 is in counting-up operation, whereas selects a coincidence signal (timing a3) transmitted from the sixth compare register 13, as an A/D start trigger when the timer 21 is in counting-down operation.

As having been explained, the A/D trigger generating circuit 1 makes it possible to start analog-digital conversion at a timing which is optimal to feedback control and at which a turning-on or -off period of the invertors and an A/D conversion period do not overlap each other.

The control circuit in accordance with the first embodiment provides the following advantages.

As mentioned above, in the control circuit in accordance with the first embodiment, the current Ia running through the three-phase invertor motor is detected for carrying out the feedback control. The A/D trigger selecting circuit 1 automatically generates an A/D trigger optimal to the feedback control. Hence, it is now possible to accomplish three-phase PWM output control and feedback control in a microcomputer.

Whereas timings necessary for carrying out feedback control are generated externally of a micro-computer in a conventional control circuit, the control circuit in accordance with the first embodiment provides advantages of reduction in the number of parts, reduction in an area of a substrate and cost reduction.

In addition, since an analog-digital convertor is always equipped in a micro-computer, a time necessary for carrying out A/D conversion can be readily associated with a waveform of a three-phase PWM output signal in one microcomputer.

For instance, if the analog-digital trigger selecting circuit 1 in the first embodiment were arranged externally of a micro-computer, it would be necessary to load a time necessary for carrying out A/D conversion, stored in a microcomputer, to an external latching device from the micro-computer, in order to set the time in the A/D conversion time setting register 17. However, such loading a time is unnecessary from the standpoint of total system.

Thus, the control circuit in accordance with the first embodiment can solve a problem which will be caused if control is made externally of a microcomputer, ensuring enhancement in controllability.

In addition, since the fifth and sixth buffer registers 12 and 14 are set through automatic calculation made between the A/D conversion time setting register 17 and the second and fourth buffer registers 25 and 29 in the three-phase PWM signal generating circuit 2, it is no longer necessary to carry out such calculation through software.

Furthermore, since the A/D trigger selecting circuit 15 is automatically operated by means of the selector 151, as illustrated in FIG. 4, it is not necessary to additionally carry out operation of the A/D trigger selecting circuit 15 through software.

The control circuit in accordance with the first embodiment provides the same functions provided by the conventional control circuit, without an increase in burden to software.

Though the timings c3 and a3 shown in the timing chart of FIG. 5 are selected as the analog-digital conversion timing in the first embodiment, a timing immediately before the timing b1 and a timing immediately before the timing b2 may be selected as the analog-digital conversion timing.

If the A/D conversion time setting register 17 is designed to store only one value corresponding to one analog-digital conversion, analog-digital conversion is carried out once on receipt of the A/D start trigger 16. If analog-digital conversion is to be repeatedly carried out a plurality of times, the A/D conversion time setting register 17 is designed to store R×T values wherein R indicates a time necessary for carrying out analog-digital conversion, and T indicates the number of repetition.

Since the repetition number is set also in an analog-digital convertor, a value reflecting the repetition number may be stored in the A/D conversion time setting register 17.

The A/D conversion time setting register 17 may be designed to be set in accordance with commands transmitted from a central processing unit, which ensures the A/D conversion time setting register 17 can be tuned through software. To this end, the A/D conversion time setting register 17 is designed to have such a structure that a value written in accordance with commands transmitted from a central processing unit is stored, if the commands are written over an automatically set value.

[Second Embodiment]

Hereinbelow is explained a control circuit in accordance with the second embodiment.

In comparison with the control circuit in accordance with the first embodiment, the control circuit in accordance with the second embodiment is designed to include the analog-digital trigger selecting circuit having a different structure from that of the analog-digital trigger selecting circuit in the first embodiment.

Figure 6:
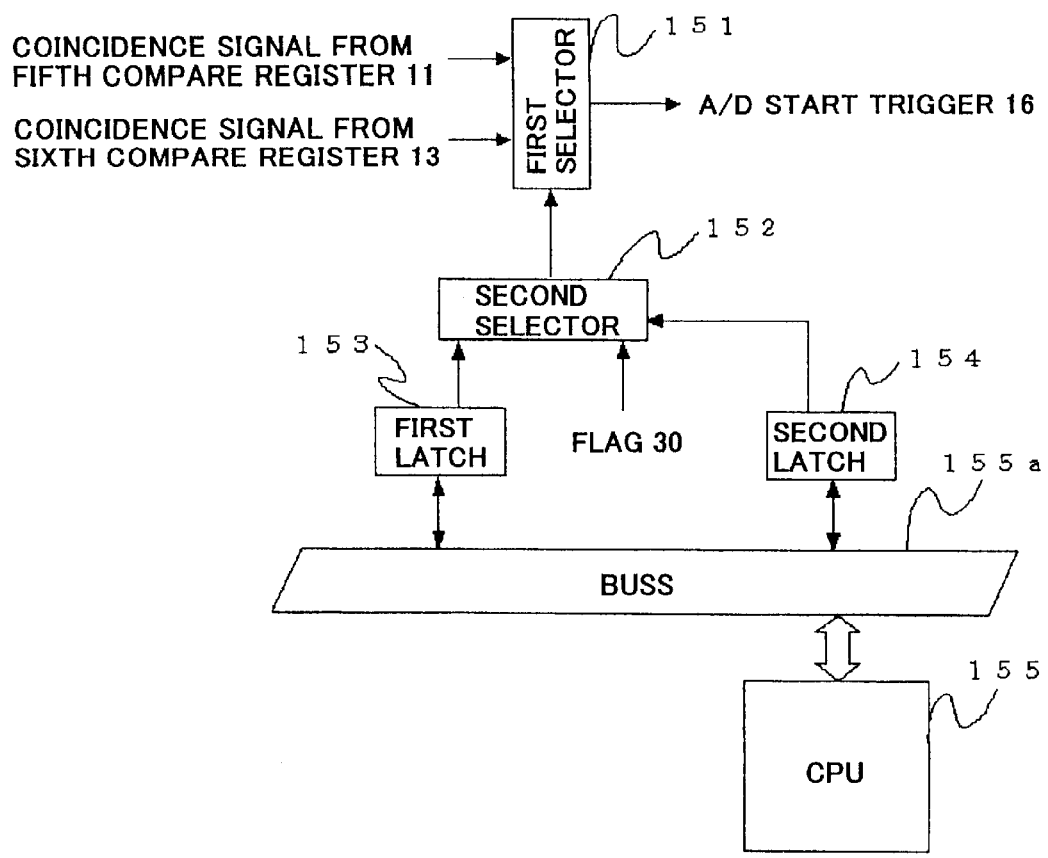
FIG. 6 is a block diagram of an A/D conversion time setting register in the control circuit in accordance with the second embodiment.

Specifically, the control circuit in accordance with the second embodiment is designed to include an A/D trigger selecting circuit 15a having such a structure as illustrated in FIG. 6 in place of the A/D trigger selecting circuit 15 having the structure illustrated in FIG. 4. The control circuit in accordance with the second embodiment has the same structure as the structure of the control circuit in accordance with the first embodiment except including the A/D trigger selecting circuit 15a in place of the A/D trigger selecting circuit 15.

With reference to FIG. 6, the A/D trigger selecting circuit 15a is comprised of a first selector 151 which receives coincidence signals transmitted from the fifth and sixth compare registers 11 and 13, a first latching device 153 which receives command signals from an external central processing unit (CPU) 155 through a bus 155a, a second latching device 154 which receives command signals from the external central processing unit (CPU) 155 through the bus 155a, and a second selector 152 which receives both output signals transmitted from the first and second latching devices 153 and 154 and an output signal transmitted from the up- and down-counting flag 30, and transmits a selection signal indicative of one of the coincidence signals, to the first selector 151.

The first and second latching devices 153 and 154 are comprised of register bits capable of reading and writing data through the bus 155a in accordance with commands transmitted from the central processing unit 155.

Hereinbelow is explained an operation of the A/D trigger selecting circuit 15a.

The A/D trigger selecting circuit 15 illustrated in FIG. 4 switches the A/D start trigger 16 in accordance with an output signal transmitted from the up- and down-counting flag 30. In contrast, in the second embodiment, the A/D trigger selecting circuit 15a switches the A/D start trigger 16 in accordance with a value stored in the first and second latching devices 153 and 154 in line with commands transmitted from the central processing unit 155.

Specifically, when the second latching device 154 outputs a signal "0", the second selector 152 selects the up- and down-counting flag 30. Accordingly, the A/D trigger selecting circuit 15a in the second embodiment operates in the same manner as the A/D trigger selecting circuit 15 illustrated in FIG. 4.

In contrast, when the second latching device 154 outputs a signal "1", the second selector 152 selects the first latching device 153.

If the first latching device 153 outputs a signal "0", the first selector 151 selects a coincidence signal transmitted from the fifth compare register 11. In contrast, if the first latching device 153 outputs a signal "1", the first selector 151 selects a coincidence signal transmitted from the sixth compare register 13.

As mentioned above, the A/D trigger selecting circuit 15a illustrated in FIG. 6 makes it possible to automatically select a coincidence signal by virtue of the up- and down-counting flag 30, and further select a coincidence signal in accordance with commands transmitted from the central processing unit 155.

For instance, if analog-digital conversion is to be carried out by a common trigger over a plurality of periods, such analog-digital conversion could be readily accomplished through the use of the A/D trigger selecting circuit 15a to select a coincidence signal in accordance with commands transmitted from the central processing unit 155.

[Third Embodiment]

In the above-mentioned first and second embodiments, a timing necessary for carrying out the feedback control to a three-phase invertor motor is accomplished through the use of the A/D trigger generating circuit 1 without an increase in dealing with signals through software. It is not always necessary to accomplish the above-mentioned functions by means of hardware, if a central processing unit has a high processing rate.

Figure 7:
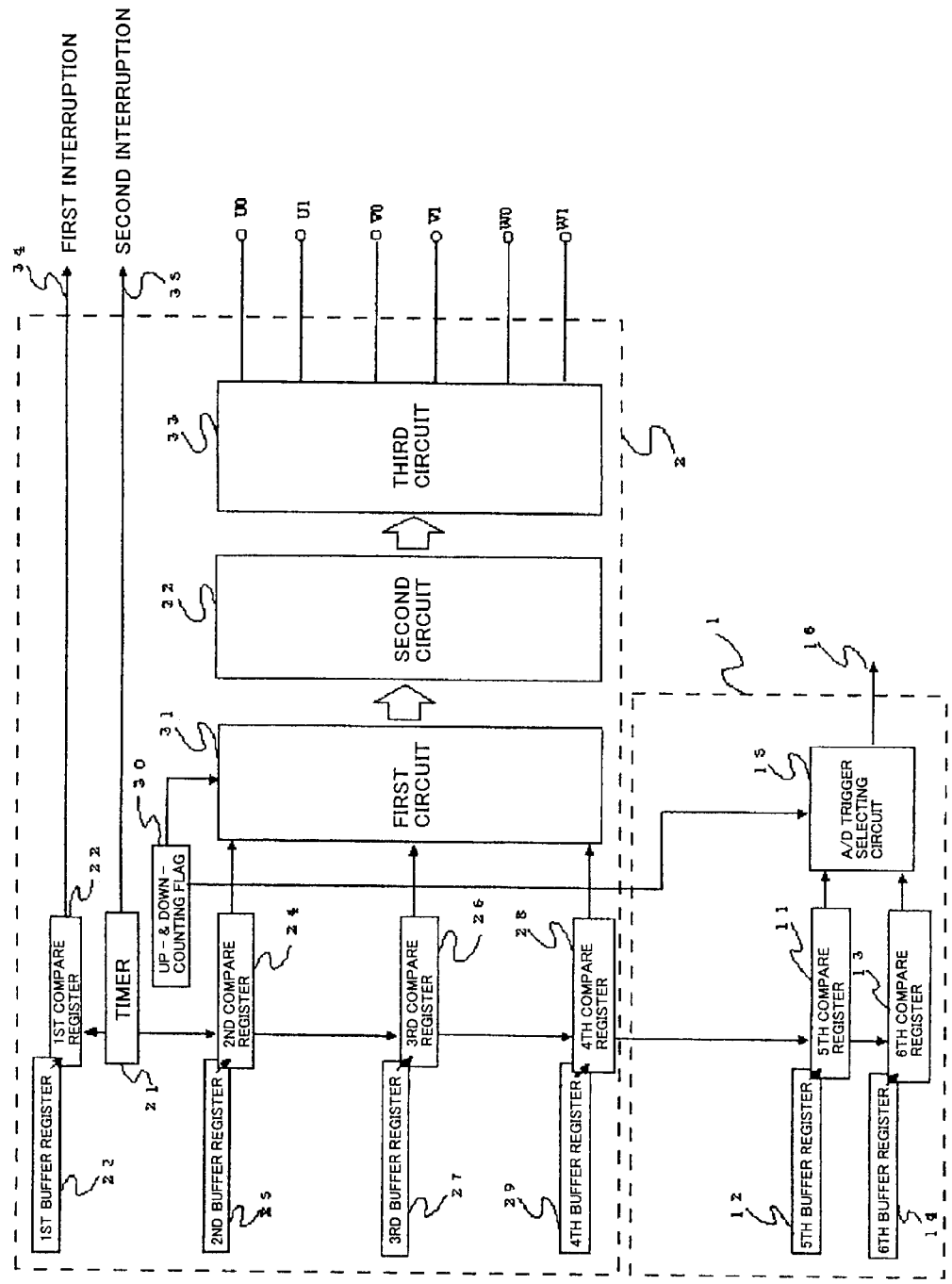
FIG. 7 is a block diagram of a control circuit in accordance with the third embodiment of the present invention.

In view of the above-mentioned matter, a control circuit in accordance with the third embodiment is illustrated in FIG. 7.

In comparison with the control circuit in accordance with the first embodiment, illustrated in FIG. 2, the A/D conversion time setting register 17 is omitted, and a function of carrying out automatic calculation to the fifth and sixth buffer registers 12 and 14 is further omitted in the control circuit in accordance with the third embodiment. Accordingly, the control circuit has to additionally carry out software processing in order to compensate for the omitted functions.

Figure 8:
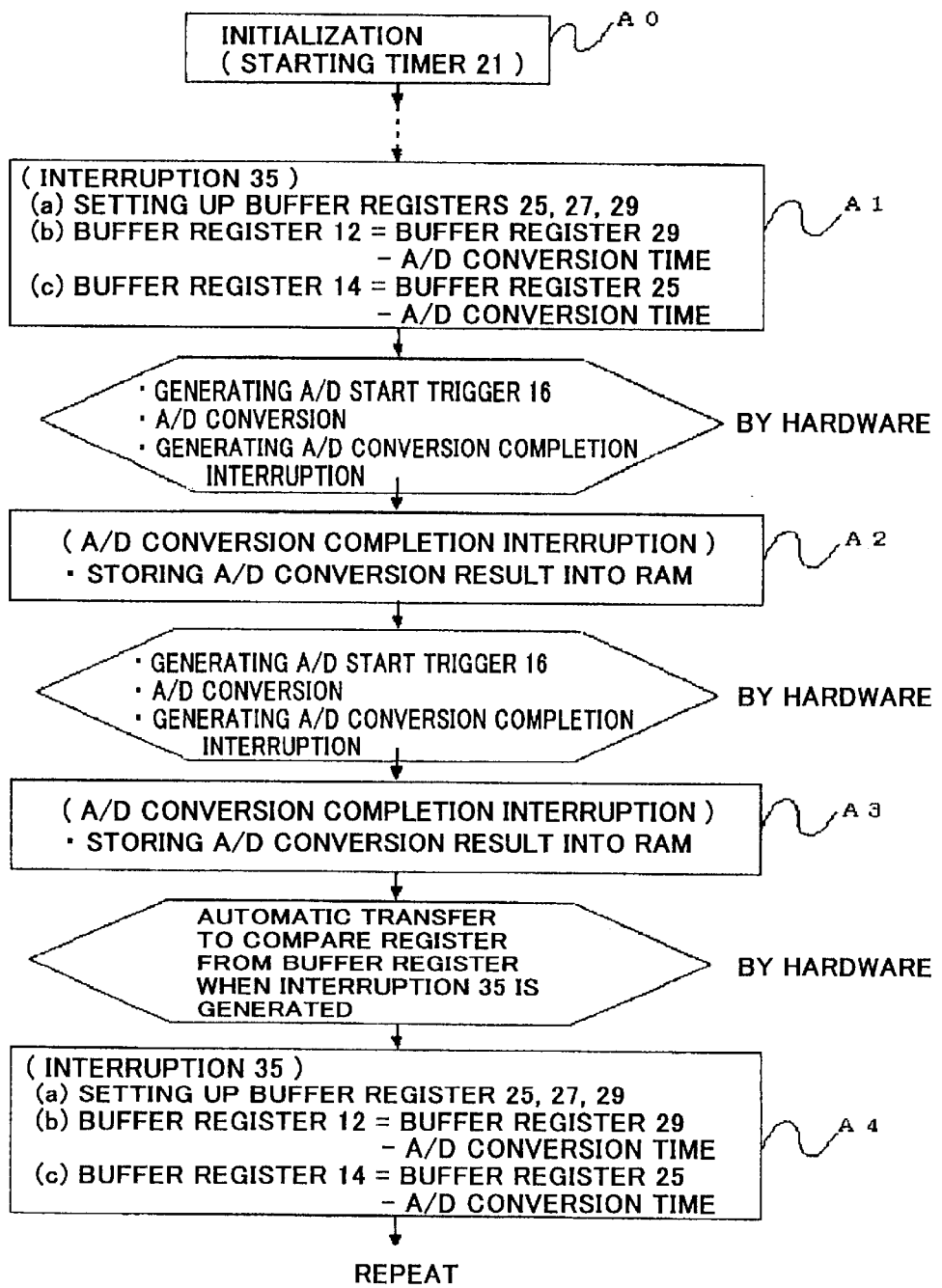
FIG. 8 is a flow chart showing an operation of the control circuit in accordance with the third embodiment of the present invention.

FIG. 8 is a flow chart of additional software processing. Hereinbelow is explained additional software processing with reference to FIG. 8. In FIG. 8, only steps to be carried out for the feedback control are shown. Specifically, later mentioned steps A0 to A4 are carried out through software. The steps A1 and A4 show what is done in the second interruption 35. In the steps A1 and A4, stets (b) and (c) among the steps (a), (b) and (c) have to be additionally carried out as a result of removal of hardware.

First, initialization is made. That is, the timer 21 is caused to start, in step A0.

Then, the second interruption 35 is carried out, in step A1, as follows.

First, the second to fourth buffer registers 25, 27 and 29 are set up, based on the result of A/D conversion having been carried out in the previous period, in step A1-(a).

Then, a difference between the fourth buffer register 29 and a time necessary for carrying out analog-digital conversion is stored in the fifth buffer register 12, in step A1-(b). Similarly, a difference between the second buffer register 25 and a time necessary for carrying out analog-digital conversion is stored in the sixth buffer register 14, in step A1-(c).

Observing values used in the calculation to be carried out in step A1-(b) and A1-(c), a value to be stored in the fourth buffer register 29 (or the second buffer register 25) is necessary for carrying out PWM output control, and is calculated based on the previous period in step A1-(a), and hence, the value is not generated additionally in the second embodiment.

A time necessary for carrying out analog-digital conversion is determined in dependence on an analog-digital convertor. In general, a time necessary for carrying out analog-digital conversion is not rewritten so frequently, and a time determined in the initialization is used without being changed. Thus, once a time necessary for carrying out analog-digital conversion has been determined, the time is not necessary to change.

Hence, since one subtraction and one addition are conducted in step Al, a load in software processing would be lightened, if a central processing unit having high calculation ability is used.

It should be noted that a load in software processing is dependent on an object which is to be dealt with by a micro-computer. Hence, a load in software processing may be high, if a micro-computer has to control many objects other than a three-phase motor.

When the fifth compare register 11 coincides with an output signal transmitted from the timer 21, the A/D conversion trigger selecting circuit 15 generates the A/D start trigger 16. On receipt of the A/D start trigger 16, an analog-digital convertor starts A/D conversion.

After the A/D conversion has been completed, there is generated A/D conversion completion interruption.

The A/D conversion mentioned above is carried out in hardware.

Then, a result of the A/D conversion is stored in a memory such as RAM, in step A2.

Then, when the sixth compare register 13 coincides with an output signal transmitted from the timer 21, the A/D conversion trigger selecting circuit 15 generates the A/D start trigger 16. On receipt of the A/D start trigger 16, an analog-digital convertor starts A/D conversion.

After the A/D conversion has been completed, there is generated A/D conversion completion interruption.

The A/D conversion mentioned above is carried out in hardware.

Then, a result of the A/D conversion is stored in a memory such as RAM, in step A3.

At this stage, the second interruption 35 is generated, and automatic transfer is made to the fifth and sixth compare registers 11 and 13 from the fifth and sixth buffer registers 12 and 14, respectively. The automatic transfer is made by means of hardware.

Hereinbelow, steps A1 to A3 are repeatedly carried out.

The control circuit in accordance with the third embodiment makes it possible to omit automatic addition, automatic subtraction, and the A/D conversion time setting register 17 or 17a storing a time necessary for carrying out analog-digital conversion, ensuring reduction in a chip size and further in chip costs.

[Fourth Embodiment]

Figure 9:
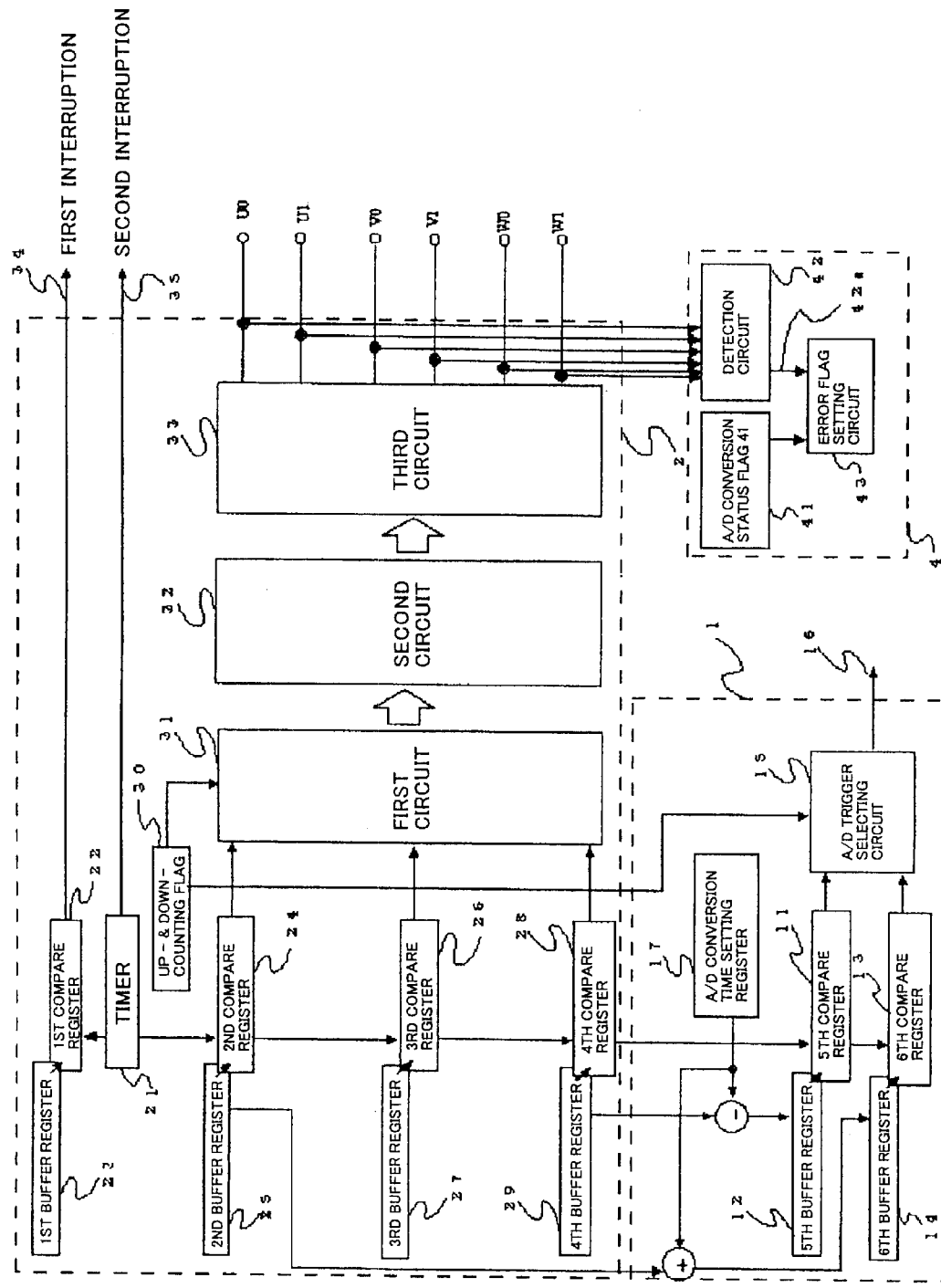
FIG. 9 is a block diagram of a control circuit in accordance with the fourth embodiment of the present invention.

FIG. 9 is a block diagram of a control circuit in accordance with the fourth embodiment.

The control circuit in accordance with the fourth embodiment additionally includes a preliminary circuit 4 in comparison with the control circuit in accordance with the first embodiment.

The preliminary circuit 4 is comprised of an analog-digital conversion status flag 41 indicating whether analog-digital conversion is being carried out, a detection circuit 42 which transmits a detection signal 42a, if the detection circuit 42 detects that at least one of terminals receiving PWM signals varies in status, and an error flag setting circuit 43 which sets an error flag when the detection signal 42a is received while the analog-digital conversion status flag 41 indicates that analog-digital conversion is being carried out.

The analog-digital conversion status flag 41 shows "1" while analog-digital conversion is being carried out, or "0" while analog-digital conversion is not being carried out. The functions of the analog-digital conversion status flag 41 are functions which an ordinary A/D convertor has. The analog-digital conversion status flag 41 in the fourth embodiment is a copy of a flag which an analog-digital convertor has.

The detection circuit 42 transmits a one-shot pulse as the detection signal 42a, when at least one of the terminals U0, U1, V0, V1, W0 and W1 varies in status.

The error flag setting circuit 43 sets a flag which shows "1" when the detection circuit 42 outputs the detection signal 42a while the analog-digital conversion status flag 41 shows "1", and stores a value of "1". In other words, the error flag setting circuit 43 sets an error flag when the three-phase PWM output terminal varies during analog-digital conversion.

As having been explained with reference to FIG. 5, the timings c3 and a3 generally do not overlap a timing at which a three-phase PWM output signal is transmitted. However, for instance, while de-bagged or in abnormal operation, the timing c3 and variation in the terminal V0 or the timing a3 and variation in the terminal V1 may overlap each other. If analog-digital conversion is carried out under such circumstance, a current in transition period in which an invertor is turned on or off is converted to a digital form from an analog form, resulting in that the feedback control cannot be accurately carried out.

The preliminary circuit 4 has a function of detecting such abnormal condition. Specifically, the preliminary circuit 4 detects abnormal condition by reading an error flag set by the error flag setting circuit 43, during analog-digital conversion completion interruption.

[Fifth Embodiment]

Figure 10:
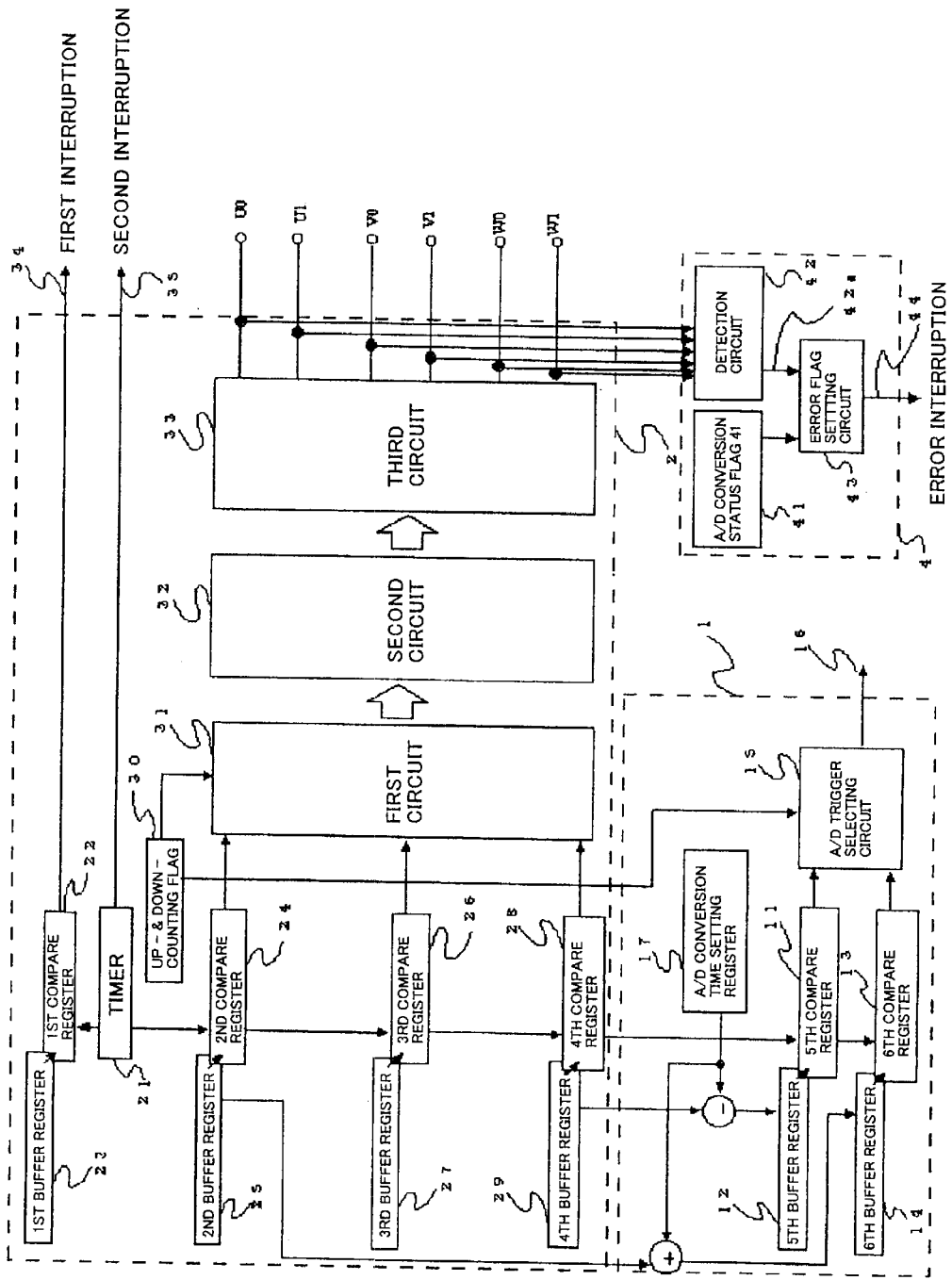
FIG. 10 is a block diagram of a control circuit in accordance with the fifth embodiment of the present invention.

FIG. 10 is a block diagram of a control circuit in accordance with the fifth embodiment.

In comparison with the control circuit in accordance with the fourth embodiment, illustrated in FIG. 9, the error flag setting circuit 43 in the fifth embodiment has a different function from the functions of the error flag setting circuit 43 in the fourth embodiment.

Specifically, the error flag setting circuit 43 in the fifth embodiment is designed to generate error interruption 44. The error interruption 44 is transmitted when the error flag 43 is set.

The error flag setting circuit 43 which transmits the error interruption 44 presents an advantage that it is possible to transmit the error interruption 44 to inform an error immediately when it occurs, without waiting for completion of analog-digital conversion. Thus, defectiveness can be timely removed.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-097409 filed on Mar. 29, 2001 including specification, claims, drawings and summary is incorporated herein by reference in its entirety.

What is claimed is:

1. A control circuit comprising:
   (a) a first circuit for generating a three-phase PWM (pulse width modulation) signal, said circuit having functions of generating a PWM signal necessary for driving a three-phase invertor motor, generating interruption at a carrier period, and generating interruption at an intermediate point of a carrier period; and
   (b) a second circuit for generating an analog-digital start trigger in synchronization with a timing at which said PWM signal is output.

2. The control circuit as set forth in claim 1, wherein said second circuit includes a first compare register having a two-staged structure, and a second compare register having a two-staged structure, and said first circuit includes a PWM timer,
   said first and second compare registers making comparison with an output signal transmitted from said PWM timer to thereby generate said analog-digital start trigger.

3. The control circuit as set forth in claim 2, wherein said first and second compare registers are automatically set up by automatic calculation of a timing at which said PWM signal is output.

4. The control circuit as set forth in claim 1, wherein said first circuit includes a PWM timer, and said second circuit generates two analog-digital start triggers, one of which is selected in synchronization with counting-up or counting-down operation of said PWM timer.

5. The control circuit as set forth in claim 1, further comprising an auxiliary circuit including:
   (a) a status flag which indicates whether analog-digital conversion is being carried out;
   (b) a detecting circuit which transmits a detection signal, when at least one of terminals which receive said PWM signal varies with respect to its status; and
   (c) an error flag setting circuit which sets an error flag when said detection signal is transmitted, while said status flag indicates analog-digital conversion is being carried out.

6. The control circuit as set forth in claim 5, wherein said error flag setting circuit generates interruption when said error flag has been set.

7. A control circuit comprising:
   (a) a first circuit for generating a three-phase PWM (pulse width modulation) signal, said circuit having functions of generating a PWM signal necessary for driving a three-phase invertor motor, generating interruption at a carrier period, and generating interruption at an intermediate point of a carrier period; and
   (b) a second circuit for generating an analog-digital start trigger in synchronization with a timing at which said PWM signal is output,
   said first circuit including a PWM timer,
   said second circuit including:
      (b1) first and second compare registers each of which makes comparison with an output signal transmitted from said PWM timer, and outputs a coincidence signal;
      (b2) first and second buffer registers associated with said first and second compare registers, respectively; and
      (b3) a third circuit which selects one of coincidence signals transmitted from said first and second compare registers, to thereby generate an analog-digital start trigger signal.

8. The control circuit as set forth in claim 7, wherein said second circuit includes a first compare register having a two-staged structure, and a second compare register having a two-staged structure, and said first circuit includes a PWM timer,
   said first and second compare registers making comparison with an output signal transmitted from said PWM timer to thereby generate said analog-digital start trigger.

9. The control circuit as set forth in claim 8, wherein said first and second compare registers are automatically set up by automatic calculation of a timing at which said PWM signal is output.

10. The control circuit as set forth in claim 7, wherein said first circuit includes a PWM timer, and said second circuit generates two analog-digital start triggers, one of which is selected in synchronization with counting-up or counting-down operation of said PWM timer.

11. The control circuit as set forth in claim 7, further comprising a register which stores a value reflecting a time necessary for carrying out analog-digital conversion in an analog-digital convertor equipped in a computer in which said control circuit is equipped in.

12. The control circuit as set forth in claim 7, wherein said second circuit further includes a selector which selects one of coincidence signals transmitted from said first and second compare registers, when said PWM timer is in counting-up operation, and selects the other, when said PWM timer is in counting-down operation.

13. The control circuit as set forth in claim 12, wherein said first circuit further includes a flag which indicates whether said PWM timer is in counting-up or counting-down operation, and transmits its output signal to said selector.

14. The control circuit as set forth in claim 7, wherein transfer to said first compare register from said first buffer register is carried out by interruption generated at underflow in said PWM timer, if said PWM timer operates in a symmetrical triangle wave.

15. The control circuit as set forth in claim 7, wherein said first circuit further includes a flag which indicates whether said PWM timer is in counting-up or counting-down operation, and said third circuit is comprised of:

(b1) a first selector which receives coincidence signals transmitted from said first and second compare registers;

(b2) a first latch device which receives a command transmitted from an external central processing unit;

(b3) a second latch device which receives a command transmitted from an external central processing unit; and (b4) a second selector which receives both output signals transmitted from said first and second latch devices and an output signal transmitted from said flag, and transmits a selection signal to said first selector to indicate which one of said coincidence signals is to be selected.

16. The control circuit as set forth in claim 7, further comprising an auxiliary circuit including:

(a) a status flag which indicates whether analog-digital conversion is being carried out;

(b) a detecting circuit which transmits a detection signal, when at least one of terminals which receive said PWM signal varies with respect to its status; and (c) an error flag setting circuit which sets an error flag when said detection signal is transmitted, while said status flag indicates analog-digital conversion is being carried out.

17. The control circuit as set forth in claim 16, wherein said error flag setting circuit generates interruption when said error flag has been set.

* * * * *